US005714901A

United States Patent [19]
Garcia

[11] Patent Number: 5,714,901
[45] Date of Patent: Feb. 3, 1998

[54] HYSTERETIC COUPLING SYSTEM

[75] Inventor: Joseph P. Garcia, Greenbelt, Md.

[73] Assignee: The United States of America as represented by the Secretary of the Navy, Washington, D.C.

[21] Appl. No.: 504,342

[22] Filed: Jul. 19, 1995

[51] Int. Cl.[6] .......... H03L 5/00
[52] U.S. Cl. .......... 327/333; 327/19; 327/355; 330/53; 340/825.5
[58] Field of Search .......... 327/333, 19, 355, 327/361; 330/84, 53, 157; 340/825.5, 825.51

[56] References Cited

U.S. PATENT DOCUMENTS

| | | | |
|---|---|---|---|
| 3,537,010 | 10/1970 | Roza et al. | 330/157 |
| 3,729,633 | 4/1973 | Eros et al. | 359/189 |
| 4,223,235 | 9/1980 | Rufray | 327/487 |
| 4,620,118 | 10/1986 | Barber | 327/19 |
| 4,656,434 | 4/1987 | Selin | 330/84 |
| 5,245,603 | 9/1993 | Newman | 370/54 |
| 5,341,052 | 8/1994 | Dike et al. | 340/825.5 |

*Primary Examiner*—Timothy P. Callahan
*Assistant Examiner*—Kenneth B. Wells
*Attorney, Agent, or Firm*—James B. Bechtel, Esq.

[57] ABSTRACT

An interconnecting network comprising operational amplifiers, summing amplifiers, and hysteretic coupling circuits is disclosed. The interconnecting network responds to signals of interest that may be substantially simultaneously present, but only to the highest initial intensity thereof so as to provide priority decoding of signals of interest. The hysteretic coupling circuit has a selectable coupling rate and a selectable coupling constant that allows the hysteretic circuit to respond in a stable so called "winner-take-all" manner, or conversely in a non-stable chaotic manner.

10 Claims, 7 Drawing Sheets

HYSTERETIC COUPLING SYSTEM

STATEMENT OF GOVERNMENT INTEREST

The invention described herein may be manufactured and used by or for the government of the United States of America, for governmental purposes, without the payment of any royalty thereon or therefor.

BACKGROUND OF THE INVENTION

The present invention relates generally to electronic intercoupling between a plurality of amplifiers in an array involved in implementing various data processing operations.

The intercoupling of a plurality of amplifiers for various signal processing purposes, is generally well known, as disclosed, for example, in U.S. Pat. Nos. 3,537,010, 3,729,633 and 4,656,434 to Rosa et al; Eros et al; and Sellin, respectively. Such prior art coupling systems between amplifiers are, however, incapable of implementing data processing functions, such as, computational optimization needing decoding priority determination of competitive input signals, and also associated memory operations. The patents to Rosa et al and Sellin, for example, are limited to impedance matching between coupled amplifiers to maximize transfer of power therebetween, while the patent to Eros et al is directed to the coupling of amplifiers in tandem for maximizing signal to noise ratio during power transfer. These prior art patents do not satisfy the needs for determining the priority of competiting input signals.

It is therefore an important object of the present invention to intercouple amplifiers of an array for competitive signal processing purposes (in contrast to enhancement of power transfer) in the performance of operations, such as pattern recognition, optimization computations or computerized switching.

SUMMARY OF THE INVENTION

The present invention is directed to a so called "hysteretic" coupling arrangement comprising an interconnecting network that receives signals of interest, sometimes simultaneously occurring, and responds only to, at any one time, the signal having the highest initial amplitude so as to provide priority decoding thereof.

The interconnecting network receives signals of interest from an input network, some of which might simultaneously be present. The interconnecting network responds to the simultaneous signal of interest having the highest initial amplitude so as to provide priority decoding of the signals of interest. The interconnecting network comprises at least first and second amplifiers, a coupling network, and at least first and second summing devices. The first and second amplifiers have input, output and feedback signal paths. The input and feedback paths are respectively connected to first and second signals of interest and to first and second priority select output signals. The first and second amplifiers provide respective first and second amplifier output signals on their respective output signal path which is routed to the output network. The coupling network has a predetermined coupling factor and receives the first and second amplifier output signals and develops the first and second priority select output signals each of which is at least proportional to the product of the first and second amplifier output signals. The at least first and second summing devices have inputs and outputs, with the inputs respectively receiving said first and second priority select output signals which are also respectively applied to said feedback signal paths of said at least first and second amplifiers. The outputs of the first and second summing devices are respectively connected to the input signal paths of said at least first and second amplifiers.

Accordingly, it is a primary object of the present invention to provide an interconnecting network that receives signals of interest, some of which might substantially and simultaneously be present, and responds to the simultaneous signal having the highest initial amplitude so as to provide for priority decoding of the signals of interest.

A further object of the present invention is to provide a hysteretic coupling arrangement having an integrating circuit and associated circuit elements having selectable values so as to provide a predetermined time constant to control the coupling rate and the coupling time constant for processing the signals of interest. The associated circuit elements are selected so that the hysteretic coupling arrangement .may have a stable or a chaotic behavior.

It is an object of the present invention to provide an interconnecting network having Coupling networks with a plurality of hysteretic coupling circuits of a number $N^2$, where N corresponds to the number of amplifiers so that the interconnecting network may be selected to accommodate any number of input signals.

Other objects, advantages and novel features of the invention will become apparent from the following detailed description when considered in conjunction with the accompanying drawings therein.

DETAILED DESCRIPTION OF THE PREFERRED EMBODIMENTS

Figure 1:
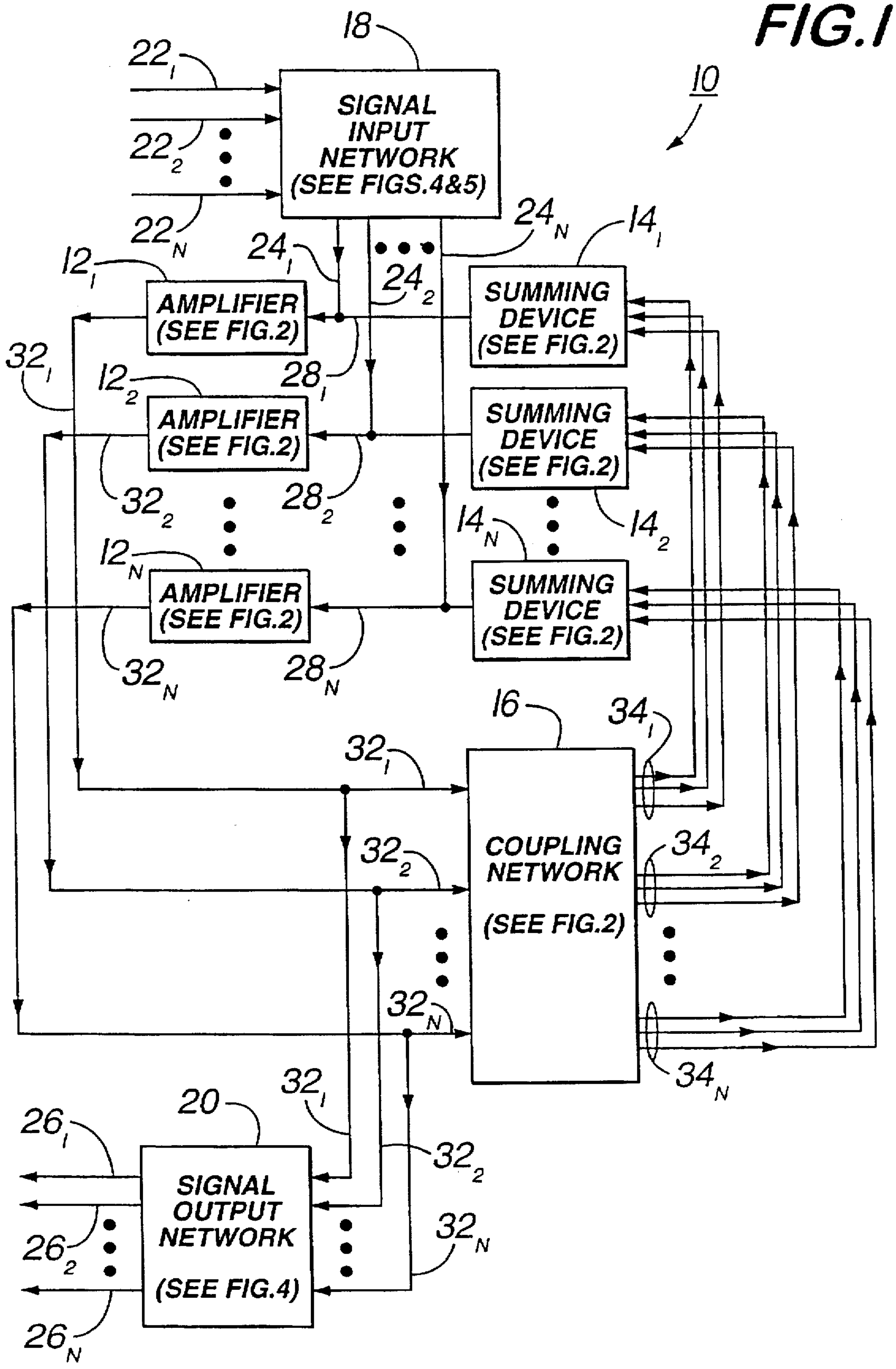
FIG. 1 is a block diagram illustrating the interrelationship of the primary elements of the present invention.

With reference to the drawings, wherein the same reference numbers indicate the same elements throughout, FIG. 1 is a block diagram illustrating the interrelationship of the primary elements of the interconnecting network 10 of the present invention. More particularly, FIG. 1 illustrates an interconnection network 10 comprising a plurality of amplifiers $\mathbf{12}_1$, $\mathbf{12}_2$, . . . $\mathbf{12}_N$, a plurality of summing devices $\mathbf{14}_1$, $\mathbf{14}_2$, . . . $\mathbf{14}_N$, and a coupling network 16. The network 10 interconnects, for pattern recognition purposes, a signal input network 18 to a signal output network 20. The signal input network 18 receives signals of interest present on signal paths $\mathbf{22}_1$, $\mathbf{22}_2$, . . . $\mathbf{22}_N$ and respectively routes these signals of interest on output signal paths $24_1$, $24_2$, . . . $24_N$ to the amplifiers $12_1$, $12_2$, . . . $12_N$. The output signal network 20 provides output signals on signal paths $26_1$, $26_2$, . . . $26_N$ that are delivered to external devices not considered to be part of the present invention, and thus, not to be further described.

In general, the signal input network 18 receives the signals of interest, some of which might substantially and simultaneously be present. The interconnecting network 10 responds to the simultaneous signal having the highest initial intensity so as to provide priority decoding of the signals of interest. The priority decoding feature of the interconnecting network 10 is particularly suited for a competing or a contention condition that arises when two devices, each represented by a signal of interest, attempt to use a single resource at the same time. The interconnecting network 10 provides contention resolution to which device gains access to the single resource when both are in contention.

The interconnecting network 10, in particular, the amplifiers $12_1$, $12_2$, . . . $12_N$, receive the signals of interest on signal paths $24_1$, $24_2$, . . . $24_N$ after such signals are conditioned by the signal input network 18, to be described with reference to FIGS. 4 and 5. Further, the priority select control signals developed by the coupling network 16 are received by respective ones of the summing devices $14_1$, $14_2$, . . . $14_N$ and the amplifiers $12_1$, $12_2$, . . . $12_N$ of FIG. 1 respectively receive the outputs of summing devices $14_1$, $14_2$, . . . $14_N$. The amplifiers $12_1$, $12_2$, . . . $12_N$ output signals are routed on signal paths $32_1$, $32_2$, . . . $32_N$. The signal paths $32_1$, $32_2$, . . . $32_N$ are all routed to the coupling network 16 and also to the signal output network 20 as shown in FIG. 1. The coupling network 16, to be further described, develops priority select control signals that are present on signal paths $34_1$, $34_2$, . . . $34_N$ and which are respectively applied to summing devices $14_1$, $14_2$, . . . $14_N$.

The coupling network 16 preferably has, for one embodiment, a plurality of hysteretic coupling circuits, to be described, of a number $N^2$, where N corresponds to the number of amplifiers $12_1$, $12_2$, . . . $12_N$ and also to the number of summing devices $14_1$, $14_2$, . . . $14_N$. The amplifiers $12_1$, $12_2$, . . . $12_N$ and the summing devices $14_1$, $14_2$, . . . $14_N$ may also be arranged into a group of rows and columns such as an x-y matrix in a manner known in the art and to be further described. Further, the amplifiers $12_1$, $12_2$, . . . $12_N$ and the summing devices $14_1$, $14_2$, . . . $14_N$ may be arranged to handle any number of signals of interest. In order that the practice of the present invention may be clearly presented, the hereinafter given description (unless otherwise specified), refers to only first and second signals of interest. The general arrangement of FIG. 1 related to processing two signals of interest may be further described with reference to FIG. 2 illustrating further details thereof.

Figure 2:
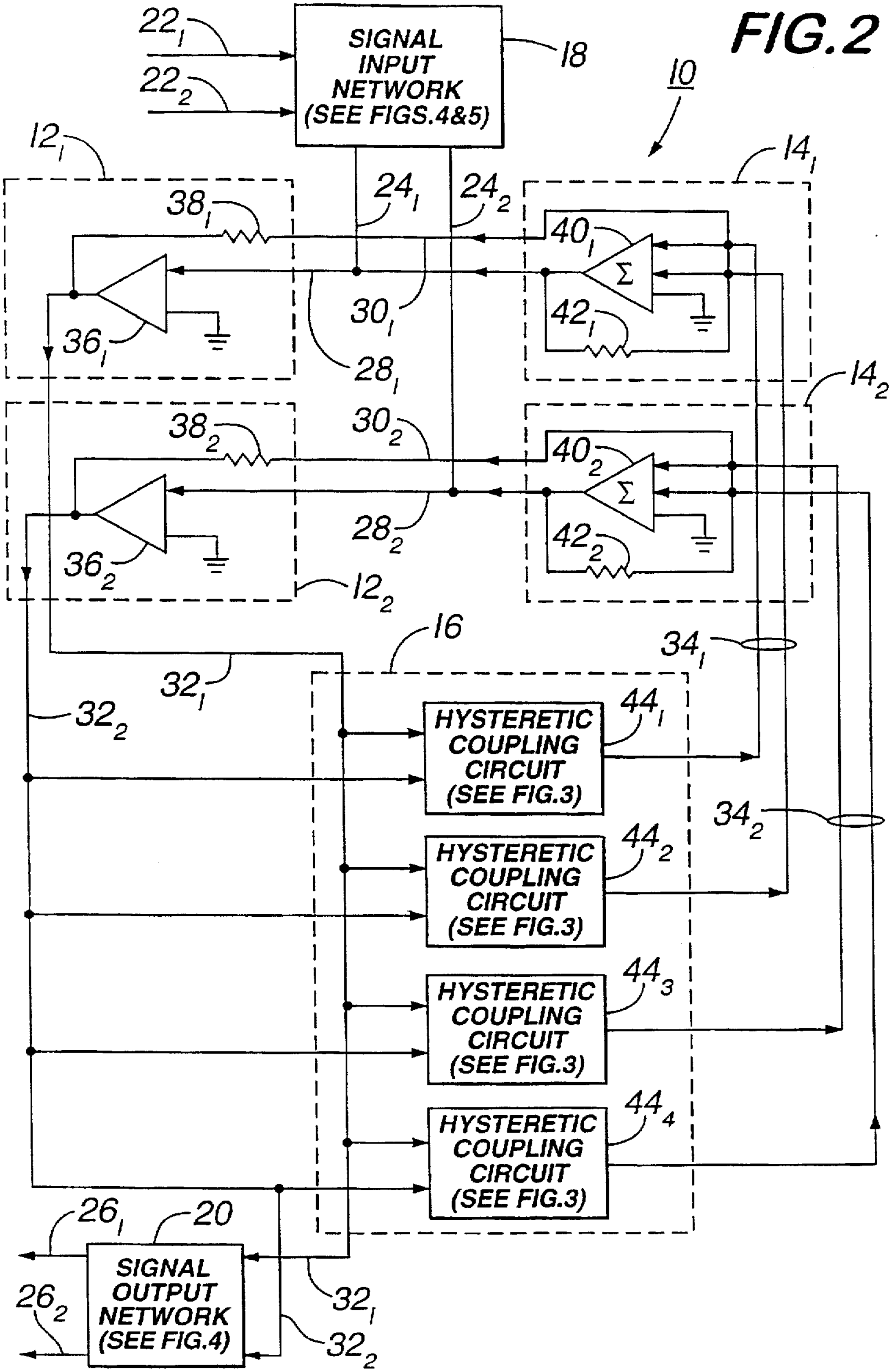
FIG. 2 is a simplified schematic illustrating an arrangement of the present invention for handling two signals of interest.

For the embodiment shown in FIG. 2, two separate signals of interest are respectively present on signal paths $22_1$ and $22_2$ which are routed to the signal input network 18. The signal input network 18, in a manner to be described, preferably conditions these two signals into a predetermined pattern that is a defined waveform, and delivers the signals of interest respectively on signal paths $24_1$ and $24_2$ which, in turn, are respectively routed on signal paths $28_1$ and $28_2$ to one input of operational amplifiers $36_1$ and $36_2$, respectively, of amplifier $12_1$ and $12_2$. The operational amplifiers $36_1$ and $36_2$ are each arranged in a standard non-inverting gain configuration and each has one of its inputs connected to ground. The outputs of operational amplifiers $36_1$ and $36_2$ are respectively connected to one end of resistors $38_1$ and $38_2$ which, in turn, have their other end connected, via feedback signal paths $30_1$ and $30_2$, to the input of summing devices $40_1$ and $40_2$ each arranged in a standard summing configuration and each of which operates in a known manner as summing amplifiers. The summing amplifier $40_1$ and $40_2$ respectively have resistors $42_1$ and $42_2$ arranged across their input and output signal paths. More particularly, each of the summing devices $40_1$ and $40_2$ is implemented, as shown in FIG. 2, with a standard op amp voltage summer and respectively have a feedback path $30_1$ and $30_2$. The outputs of summing amplifiers $40_1$ and $40_2$ are respectively connected to signal paths $28_1$ and $28_2$. The outputs of amplifiers $36_1$ and $36_2$ are routed, in parallel, via signal paths $32_1$ and $32_2$, to hysteretic coupling circuits $44_1$, $44_2$, $44_3$, and $44_4$, comprising the coupling network 16. It should be noted that, and in a manner as previously mentioned, there are four ($N^2=4$) hysteretic circuits 44 used to accommodate two (N=2) amplifiers 12. The output paths $32_1$ and $32_2$ are also routed to the signal output network 20.

In the example of FIG. 2, four hysteretic coupling circuits ($44_1$, $44_2$, $44_3$ and $44_4$) are required because in the illustrated example there are two primary amplifiers $12_1$ and $12_2$ (implemented by op amps in a non-inverting gain configuration) and in order to represent all the possible coupling arrangements thereof, one must have to represent the coupling from the $1^{st}$ ($12_1$) to the $2^{nd}$ ($12_2$) amplifiers, and the $2^{nd}$ ($12_2$) to the $1^{st}$ ($12_1$) to itself and the $2^{nd}$ ($12_2$) to itself. This results in four coupling elements for the illustrated example. In general N primary amplifier elements ($12_1$ . . . $12_N$), requires N×N coupling elements ($44_1$ . . . $44_N$).

Further, because the coupling circuit ($44_1$ . . . or $44_N$) has an integral response, there is a lag time due to the time it requires for the integration process to occur. The lagging time response is sometimes referred to as a hysteresis effect which adjective thereof is used herein by referring to the coupling elements $44_1$ . . . $44_N$ as being hysteretic coupling circuits. More particularly, the definition of hysteresis as used in the art is generally referred to herein as "The failure of a property that has been changed by an external agent to return to its original value when the cause of the change is removed." In the operation of the present invention, the coupling from the ith (such as amplifier $12_1$) element to the jth element (such as amplifier $12_2$) is proportional to the integral of the product of the ith and jth output voltage signals. With regard to the present invention, i.e., the coupling, has been changed by an external factor, i.e., the integral of the two output signals. This change persists even if the external factor is removed and, thus, is considered to manifest a hysteresis effect.

In general, the coupling network 16 of FIG. 2 has a predetermined coupling factor and receives the first and second amplifier output signals present on signal paths $32_1$ and $32_2$ and, in response thereto, develops first and second priority select output signals that are presented on signal paths $34_1$ and $34_2$ and which are respectively routed to the inputs of summing amplifiers $40_1$ and $40_2$ which, in turn, act as means to provide feedback paths to the amplifiers $36_1$ and $36_2$. It should be noted that signal path $34_1$ includes the output signals of hysteretic coupling circuits $44_1$ and $44_2$ and signal path $34_2$ includes the output signals of hysteretic coupling circuits $44_3$ and $44_4$. It should be further noted for the illustrated example of FIG. 2, that the number (N) of the output signals (4) from the hysteretic coupling circuits $44_1$ . . . $44_4$ corresponds to $N^2$ of the number (2) of amplifiers $12_1$ and $12_2$. The priority select output signals are at least proportional to the product of the first and second amplifier output signals on signal paths $32_1$, and $32_2$. Further, as will be described, each of the priority select output signal on signal paths $34_1$ and $34_2$ is also representative of a positive integral function developed with respect to a predetermined time constant. Each of the hysteretic coupling circuits $44_1$, $44_2$, $44_3$ and $44_4$ operates in a similar manner and may be further described with reference to FIG. 3 illustrating a hysteretic coupling circuit $44_1$ comprising elements given in Table 1.

TABLE 1

| REFERENCE NO. | ELEMENT |
|---|---|
| 46 | First Analog Multiplier |
| 48 | Second Analog Multiplier |
| 50 | Diode |
| 52 | Diode |
| 54 | Operational Amplifier |
| 56 | Ground Leakage Resistor |
| 58 | Circuit Weighting Resistor |
| 60 | Feedback Capacitor |
| 62 | Interconnecting Resistor |

Figure 3:
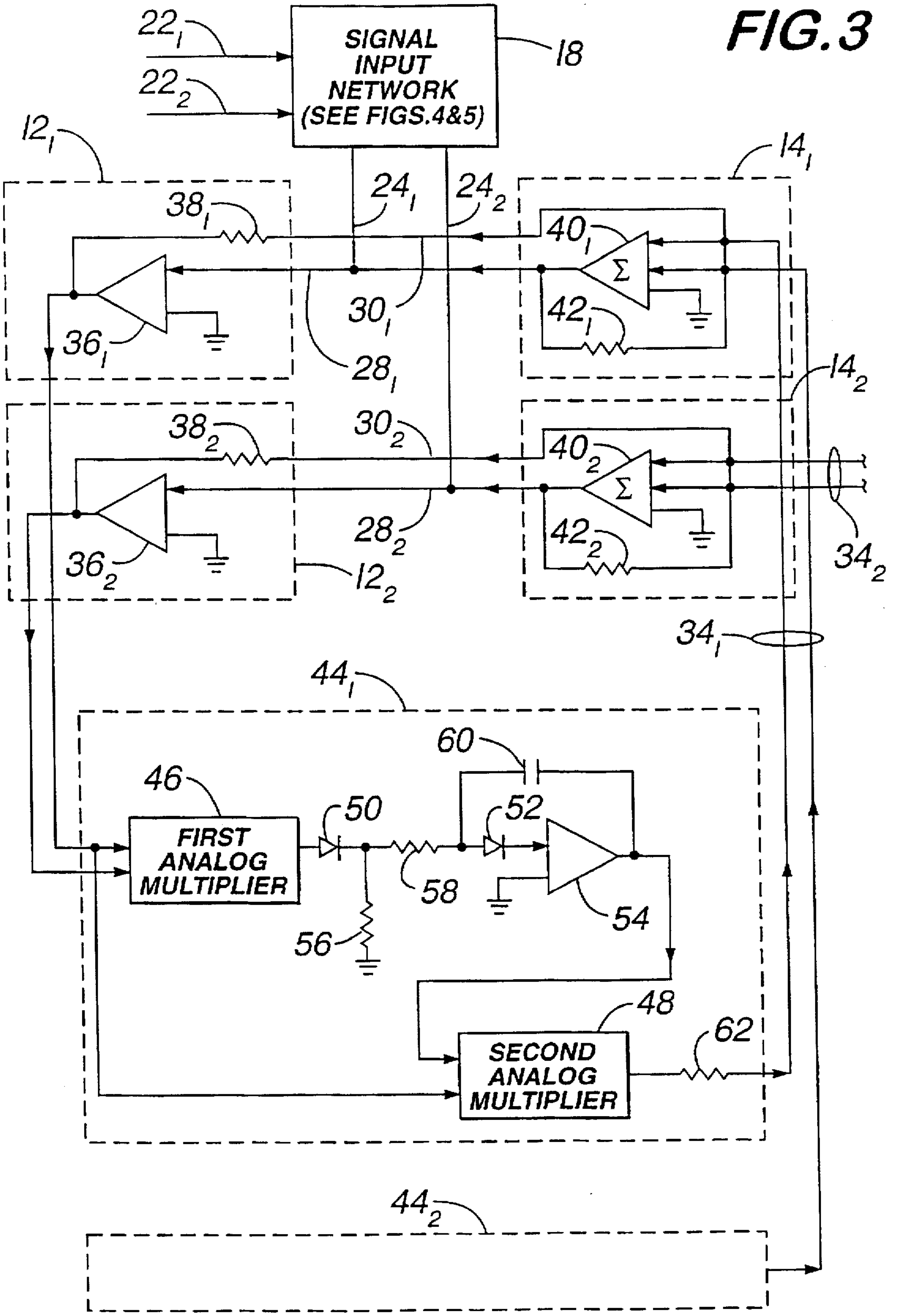
FIG. 3 is a schematic illustrating further details of the hysteretic coupling circuit generally shown in FIG. 2.

In general, the first analog multiplier 46 receives the first and second amplifier output signals on signal paths $32_1$ and $32_2$ from amplifiers $36_1$ and $36_2$ and develops a first product signal of the received signals which is routed to an integrating circuit formed by elements 50, 52, 54, 56, 58 and 60 arranged as shown in FIG. 3. A respective interconnecting resistor 62 is at the output of each hysteretic coupling element, such as hysteretic coupling element $44_1$ of FIG. 3, that proceeds into the respective summing device, such as the summing device $14_1$ that is connected to both hysteretic coupling elements $44_1$ and $44_2$, as shown in FIG. 2. If desired, the resistor 62 may be considered to be part of the respective summing device. The summing devices, such as $14_1$, desire that the input resistance be the same as the feedback resistance and, thus, for the embodiment shown in FIG. 2, the value of the interconnecting resistor 62 of the hysteretic coupling circuits $44_1 \ldots 44_4$ should be the same as the value of feedback resistor $42_1$ and $42_2$. The integrating circuit receives the output of the first analog multiplier 46 and has a predetermined time constant primarily established by the circuit weighting resistor 58, but also contributed to by the ground leakage resistor 56. The integrating circuit, in particular, the amplifier 54 develops a delayed output signal representative of the first product signal and the predetermined time constant which, in turn, is routed to the second analog multiplier 48. The second analog multiplier 48, in addition to receiving the output of amplifier 54, also receives at least one of the amplifier output signals from amplifiers $36_2$ respectively present on signal paths $32_1$ and $32_2$ which, for the embodiment shown in FIGS. 2 and 3, is the output signal developed by the first operational amplifier $36_1$. The second analog multiplier 48 develops a corresponding priority select signal which is representative of the product of the first signal of interest (output of operational amplifier) and the product of first and second signals of interest that has been positively integrated and delayed by the predetermined time constant primarily established by the circuit weighting resistor 58, but also contributed to by the resistive value of resistor 56.

As shown in FIG. 3, the diodes 50 and 52 serve as diode means for interconnecting the operational amplifier 54 between the first and second analog multipliers 46 and 48 and also act to prevent negative integration of the product (output of first multiplier 46) of the first and second signals of interest, during the development of the priority select output signals present on signal path $34_1$. The feedback capacitor 60 provides for positive integration developed, with respect to the predetermined time constant, of the product signal of the first multiplier 46.

In operation, and with reference to FIG. 3, each hysteretic coupling circuit, such as circuit $44_1$, establishes non-linear coupling between a pair of amplifiers $36_1$ and $36_2$ by providing a priority select output signal such as that which may be applied to signal path $34_1$. The priority select output signal on signal path $34_1$ is routed to the input of the summing amplifier $40_1$ and also to the resistor $38_1$, byway of feedback path $30_1$. From FIG. 3 it should be noted that signal path $34_1$ comprises the output signals from hysteretic coupling circuits $44_1$ and $44_2$ that are routed to and are summed by summing amplifier $40_1$. The priority select output signal present on signal path $34_1$ is proportional to the product of the output signals of amplifiers $36_1$ and $36_2$ present on signal path $32_1$ and $32_2$. In addition, the priority select output signal on signal path $34_1$ is proportional to the product (multiplier 46) of the output signals of amplifier $36_1$ and $36_2$ integrated and delayed by the predetermined time constant of hysteretic circuit $44_1$, and then multiplied again (multiplier 48) by the output signal of amplifier $36_1$ present on signal path $32_1$. Further, the priority select output signal present on signal path $34_1$ is dependent upon the relative gains and time constants jointly contributed to by the circuit elements of the hysteretic coupling circuits $44_1$, $44_2$, $44_3$, and $44_4$, all arranged in parallel with each other. These relative gains and time constants are primarily established by the selection of the associated circuit components of the hysteretic coupling circuit, such as $44_1$. Further, the gains and time constants are selected to establish a response time for servicing the signals of interest present at the input signal paths $22_1$ and $22_2$. The gains and time constants, as well as the values of the associated circuit components, are selectable in a manner known in the art.

In the present invention a competitive dynamical process occurs among the array of primary amplifiers, implemented by op amps in a non-inverting gain configuration and shown in FIG. 3 as amplifiers $12_1$ and $12_2$. This process is controlled by the coupling elements, such as the coupling network $44_1$ of FIG. 3. There are N squared coupling elements ($44_1 \ldots 44_N$) for N primary amplifiers $12_1 \ldots 12_N$. For the embodiment illustrated in FIGS. 2 and 3, there are four (4) coupling elements $44_1 \ldots 44_4$ which correspond to two (2) amplifiers $12_1$ and $12_2$. In general, a given coupling element between the ith and jth amplifiers generates a voltage proportional to the integral of the product of the ith and jth amplifier voltages times the voltage of the ith amplifier. For the embodiment of FIG. 3, amplifier $12_1$ may be considered the ith amplifier, amplifier $12_2$ may be considered jth amplifier and the operational amplifier 54 and resistors 56 and 58 of coupling element $44_1$ may be considered as the means for generating the voltage proportional to the integral of the product of the ith and jth amplifiers ($12_1$ and $12_2$ respectively). Further, for example, assume that the signal of interest $24_2$ associated with amplifier $12_2$ has a higher instantaneous amplitude than that of the signal of interest $24_1$ associated with amplifier $12_1$. The operational response of the coupling element, such as $44_1$ causes the instantaneous amplitude of the ith amplifier ($12_1$) to be decreased proportionally to the integral of the product while the instantaneous amplitude of the jth amplifier ($12_2$) is increased proportionally to the integral of the product. More particularly, as seen in FIG. 3, the instantaneous amplitude of the ith amplifier ($12_1$) is applied to the first analog multiplier 46 and also to the second analog multiplier 48, whereas the instantaneous amplitude of the jth amplifier ($12_2$) is only applied to the first analog multiplier making this decreasing and increasing relationship possible. Specifically, the output of the ith amplifier ($12_1$) is allowed to be first multiplied by the second analog multiplier which is then followed by the completion of the integration operation performed by the sequential operation of the first analog multiplier 46 and the op-amp 54. The hysteretic coupling circuits $44_1$ and $44_2$ feed the summing device $14_1$ which, in turn, presents a decreasing voltage to amplifier $36_1$ until its output is decreased to zero, whereas the hysteretic coupling circuits $44_3$ and $44_4$ feed the summing device $14_2$ which, in turn, presents an increasing volt, age to amplifier $36_2$ until its output reaches a maximum amount.

Again with reference to FIG. 3, and by way of example, the highest initial output signal from the operational amplifier $36_1$ or $36_2$ is recognized by a hysteretic coupling $44_1$ which produces the priority select output signal on path $34_1$ which allows the operational amplifier $36_1$ or $36_2$ having the initial highest output to remain high, while causing the other operational amplifier $36_1$ or $36_2$ to be driven low or to a zero voltage. The high and low conditions of the operational amplifiers, sometimes referred to as a multi-stability condition, is exhibited because of the resistive weighting, in particular resistor 58, of the hysteretic circuits $44_1$, $44_2$, $44_3$ and $44_4$ and because of the interrelationship of the amplifiers $12_1$ and $12_2$ and summing devices $14_1$ and $14_2$.

An additional advantage of the operation of the circuit arrangement illustrated in FIG. 3 is that it is not necessary for the signals of interest to have distinct priority levels. In the cases where two or more signals of interest have the same priority level, random noise may be used to effectively make one of the levels of amplitude slightly larger than the other. This particular treatment of the levels of the initial amplitudes will cause one signal of interest to win the winner-take-all process.

If desired, the resistors 56 and 58 may be selected to each be of a variable type so as to respectively control the coupling rate and the coupling time constant of the respective hysteretic circuit $44_1$, $44_2$, $44_3$ and $44_4$ which, in turn, control the coupling rate and coupling time constant at which the interconnecting network 10 services or responds to the signals of interest applied to the signal input network 18. By changing these resistances using variable resistors or equivalent means (56 and 58), (either or both), the hysteretic circuit's ($44_1$ . . . $44_N$) behavior can be changed from a stable behavior, herein referred to as a winner-take-all behavior, to that of chaotic behavior. The ability to change these resistances (56 and 58), by appropriate means known in the art, during the course of a computation may also be very useful. For instance, in the beginning of a computation, that is, at the beginning of the selected period at which the interconnecting network 10 services the signals of interest, it may be desirable to have the hysteretic circuit have a chaotic behavior regime. Later on in the computation, the computations may desire that the hysteretic circuit have a stable (winner-take-all) regime. The change (altering the resistance values of resistors 56 and 58) could be implemented abruptly or gradually in a manner also known in the art. The above described process related to operating in the chaotic regime may be equated to the so called chaotic analog classification of the well known noise annealing techniques, used in artificial neural networks.

It should now be appreciated that the practice of the present invention provides for an interconnecting network 10 that receives signals of interest from an input network 18, some of which might simultaneously be present, and responds to the simultaneous signal having the highest initial amplitude so as to provide for priority decoding of the signals of interest.

It should be further appreciated that the practice of the present invention provides for a hysteretic circuit having a predetermined time constant, wherein the coupling rate and the coupling time constant may be modified so as to provide for a so called stable-winner-take-all behavior or a chaotic behavior.

The present invention, generally shown in FIG. 1, may be used in competitive dynamic processing applications requiring priority determination for ascertaining the order of servicing two different computations competing for a single computational resource. For such applications, the amplifiers may be considered as matrix array $12_{NN}$ interconnected in a cross-wise manner, wherein the output of one amplifier in each of the array $12_{NN}$ is connected in common to the signal output network 20 and to at least two hysteretic coupling circuits (not shown) $44_1$, $44_2$, . . . $44_N$. Such an arrangement may be used to implement a dynamic system in order to solve certain optimization problems, such as those associated with the determination of the best route for a traveling salesman to seek out in order to visit N number of locations. In such an arrangement, each amplifier of the array $12_{NN}$ is simultaneously involved in two competitive dynamic processes that define the rows and columns of the competition. More particularly, the arrangement of the amplifiers $12_1$, $12_2$, . . . $12_N$ may be made into competing rows and columns that enable one amplifier in an associated row and column to obtain a high amplitude state, while the other amplifier in the non-associated row and column is driven low. For such an arrangement, the signals of interest applied to the signal paths $22_1$, $22_2$, . . . $22_N$ may be selected to represent inverse distances between sales locations and are conveyed by a two dimensional bus (x-y matrix) to the amplifier array $12_1$, $12_2$, . . . $12_N$. For such an arrangement, the interconnecting network 10 may be used so as to supply priority for a dynamic system for the competing signals of interest allowing for a condition of static equilibrium so that the needed computations may be performed in an optimized manner without being unnecessarily disturbed to handle simultaneously occurring requests for the same computational resource. Such an optimum performance may be still further improved by increasing the gain or the integration of time constant of the hysteretic coupling circuits $44_1$, $44_2$, . . . $44_N$, so that the system shown in FIG. 1 goes unstable and then by slowly reversing the chaotic regime, by changing the values of resistors 56 and 58, to gradually convert to a stable behavior.

Figure 4:
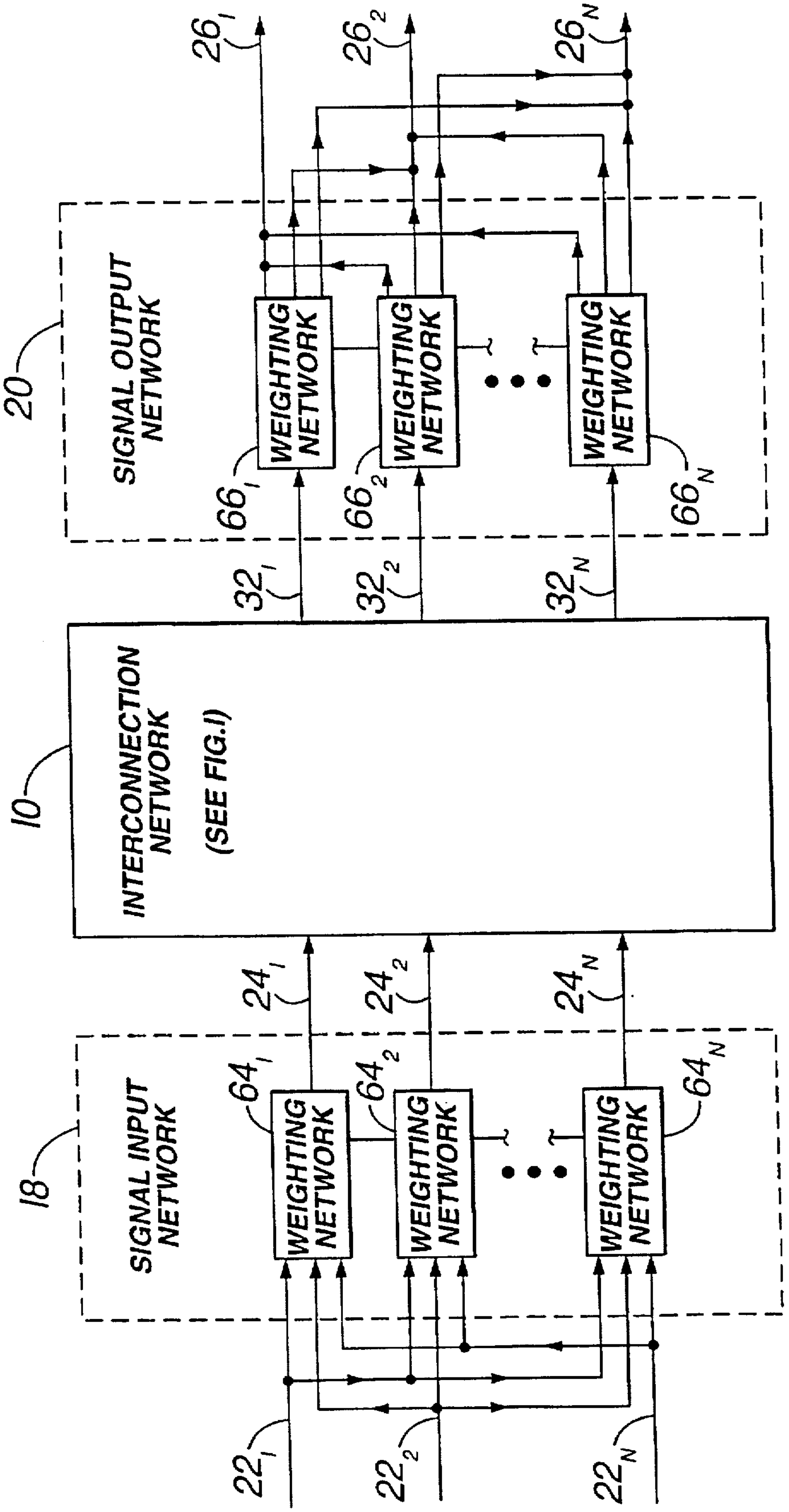
FIG. 4 is a block diagram generally illustrating the interrelationship between receiving input signals of interest and providing a predetermined output pattern by selecting the parameters of the weighting networks of the signal input and output networks.

In addition to the priority decoding provided by the interconnecting network 10, the input signal network 18 and the signal output network 20 may also be arranged so as to provide for predetermined patterns of signals of interest that is a defined waveform, and such may be further described with reference to FIG. 4. The arrangement shown in FIG. 4 may be utilized to accommodate associated memory applications that compare the contents of incoming data to determine which data access memory rather than by directly accessing predetermined locations of memory assigned to the data. The input network 18 comprises weighting network $64_1$, $64_2$ . . . $64_3$ and, similarly, the signal output network 20 comprising weighting networks $66_1$, $66_2$, . . . $66_N$. The parameters of and the interconnection between the weighting networks $64_1$, . . . $66_N$ may be selected so that each of the respective inputs and outputs may be weighed differently so as to derive a corresponding predetermined input pattern and a corresponding predetermined output pattern. The parameters and interconnection between the weighting networks $64_1$, $64_2$, . . . $64_N$ may be selected, in a manner known in the art, so that the outputs present on signal paths $24_1$, $24_2$, . . . $24_N$ is a summation of the signals of interest present on signal paths $22_1$, $22_2$, . . . $22_N$ corresponding to a particular signal pattern. As seen in FIG. 4, the signal paths $22_1$, $22_2$, . . . $22_N$ are fully connected, that is, each signal path $22_1$, $22_2$ . . . $22_N$ is distributed to all weighting networks $64_1$, $64_2$ . . . $64_N$. Similarly, as also seen in FIG. 4, the weighting networks $66_1$, $66_2$ . . . $66_N$ are also fully connected, that is, each of the weighting networks $66_1$, $66_2$, . . . $66_N$ provides a plurality of outputs that are respectively connected to each of the output signal paths $26_1$, $26_2$ . . . $26_N$ of weighting networks $66_1$, $66_2$ . . . $66_N$. Further, the parameters and interconnections between the weighting network $66_1$, $66_2$, . . . $66_N$ may be further selected so as to provide an arrangement forming an inverse transformation, relative to the signals on signal paths $22_1$, $22_2$, . . . $22_N$, so as to avoid output signal corruption by noise and insure complete generation of a corresponding signal output pattern. Further, the parameters and interconnections between the input weighting networks $64_1$ . . . $64_N$ may be selected to provide substantially any output pattern using output weighting appearing on signal paths $26_1$, $26_2$, . . . $26_N$ of weighing networks $66_1$ . . . $66_N$ desired to be composed from any input pattern appearing on signal paths $22_1$, $22_2$, . . . $22_N$.

Figure 5:
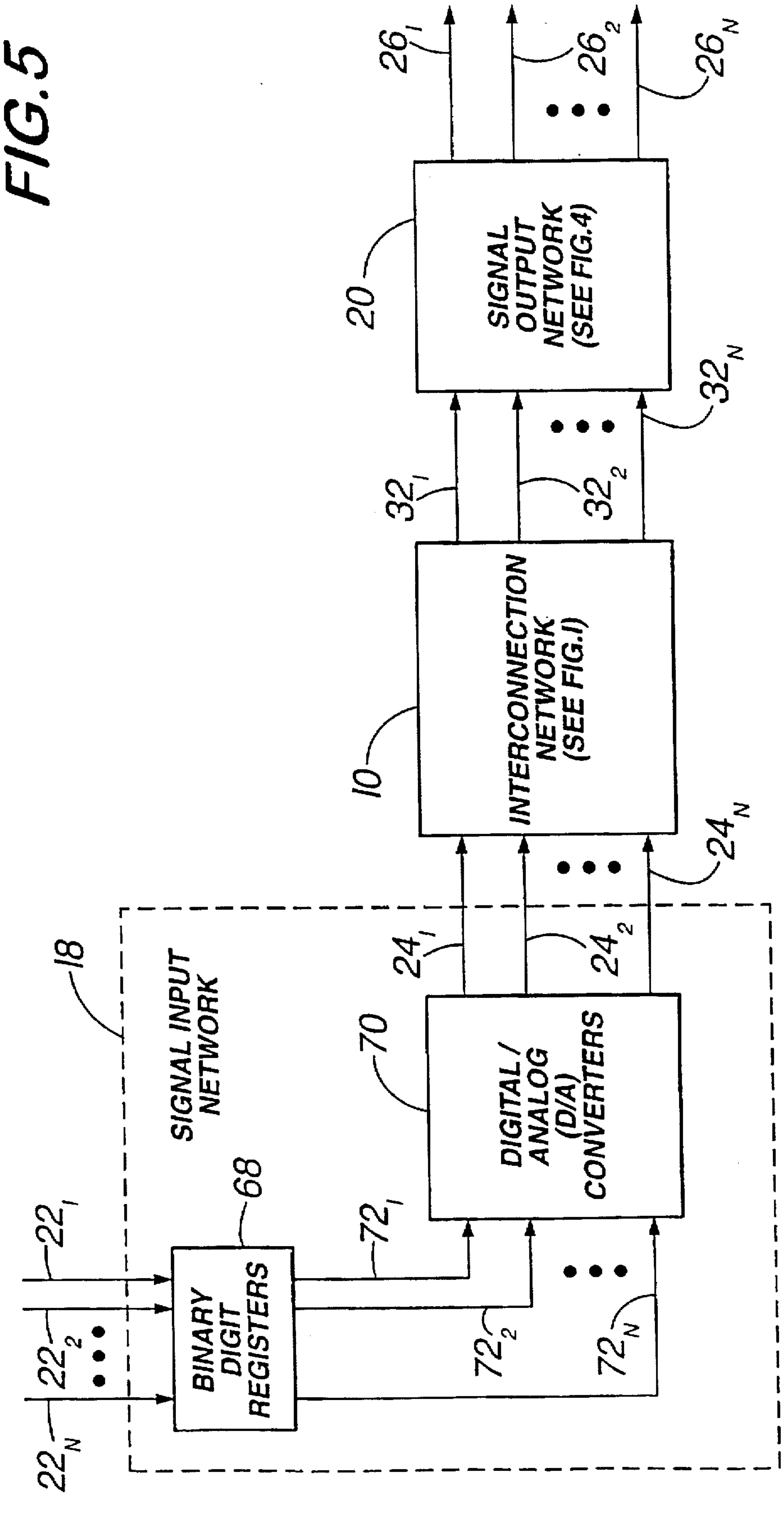
FIG. 5 illustrates a maximum voltage value selector alternate embodiment of the signal input network of FIG. 1.

In addition to the arrangement shown in FIG. 4, the signal input network 18 may have an embodiment illustrated in FIG. 5. As seen in FIG. 5, the signal input network 18 comprises binary digit registers 68 and digital/analog (D/A) converters 70 that are interconnected by signal paths $72_1$, $72_2$, . . . $72_N$. The binary digit registers 68 accept the digital signals of interest on input signal paths $22_1$, $22_2$, . . . $22_N$, and the digital/analog converters 70 provide the analog output signals present on signal paths $24_1$, $24_2$, . . . $24_N$ which are analog quantities representative of the digital units of the signals of interest present on signal paths $22_1$, $22_2$ . . . $22_N$. Each of the signals present on signal paths $24_1$, $24_2$, . . . $24_N$ is accordingly derived from one of a plurality of binary digit registers 68 in cooperation with the associated stage of the D/A converters 70. As previously discussed with reference to FIGS. 1–3, the interconnecting network 10 operates so that the largest value of binary digit output of the binary digit registers 68 causes a corresponding analog output signal to be present on signal path $26_1$, $26_2$, . . . or $26_N$, whereas the other signals are controlled by the interconnecting network 10, in particular those of amplifiers $12_1$, $12_2$, . . . $12_N$, and are driven to their low condition.

Figure 6:
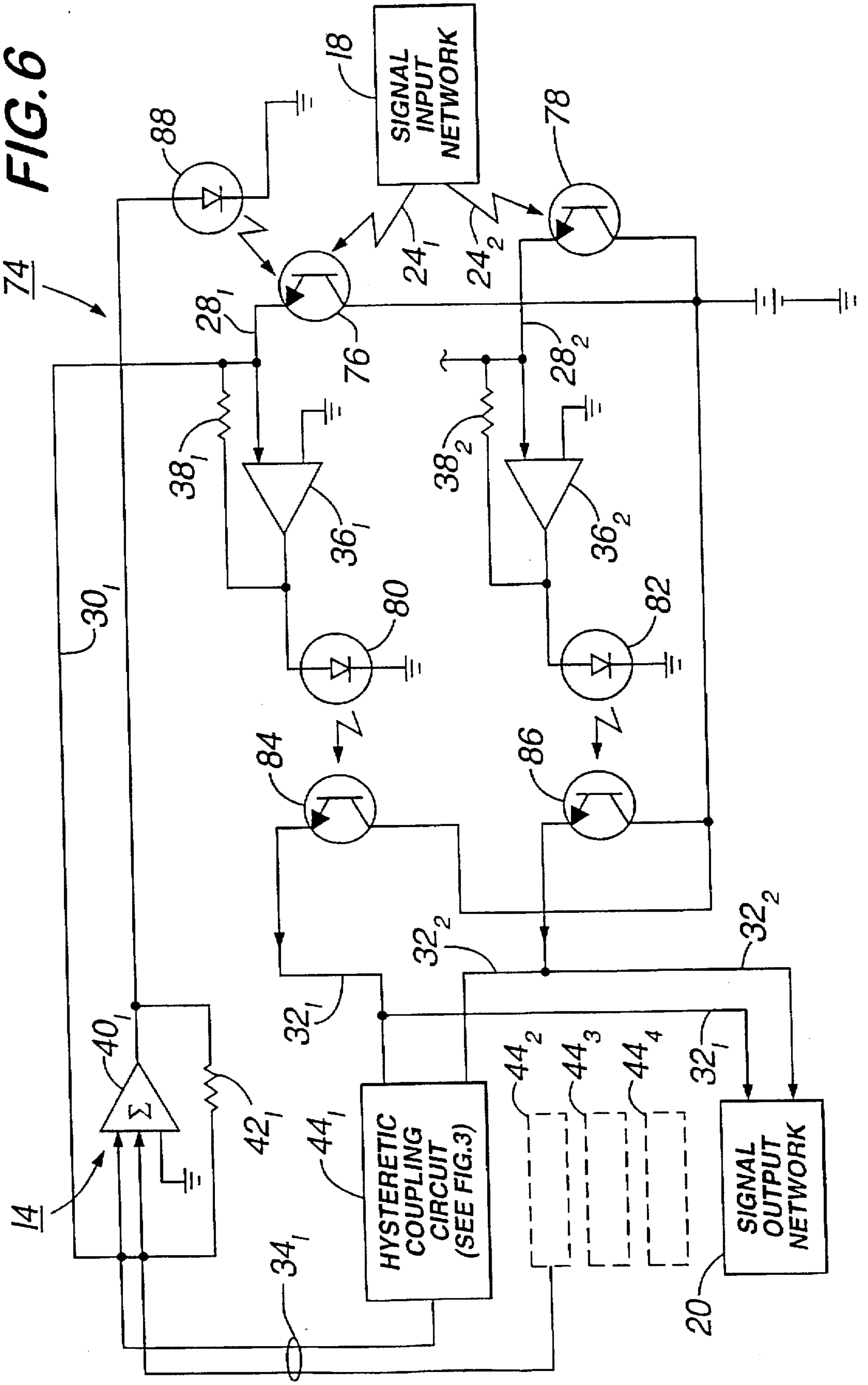
FIG. 6 illustrates an alternate embodiment of the present invention providing an optical interconnecting network.

In addition to the electronic embodiment shown in FIGS. 1–3, the signal input network 18 may provide optical signals and an alternative interconnecting network, in particular, the optical interconnecting network 74 of FIG. 6 may respond thereto. Furthermore, the optical interconnecting network 74 is particularly suited for optical electronics that involve the use of visible light for communications or for data-transfer purposes. FIG. 6, in a manner similar to FIG. 2, depicting only two signals of interest, illustrates the optical electronic signal input network 18 as providing optical signals present on signal paths $24_1$and $24_2$, shown as the actual light-type signal that are respectively transmitted to photovoltaic devices 76 and 78 (arranged as shown). The photovoltaic devices 76 and 78 respectively transmit a representative electronic signal on signal paths $28_1$ and $28_2$. The signal paths $28_1$ and $28_2$ are respectively routed to operational amplifiers $36_1$ and $36_2$, previously described, which, in turn, provide for amplified outputs that are respectively routed to light emitting devices 80 and 82 (arranged as shown) which, in turn, respectively energize photovoltaic devices 84 and 86 (arranged as shown) which, in turn, respectively produce the output signals present on signal paths $32_1$ and $32_2$. The signal paths $32_1$ and $32_2$ are routed to the hysteretic coupling circuit $44_1$ and to the signal output network 20, both previously discussed with reference to FIG. 3. Also as previously discussed with reference to FIG. 2, in actuality there are four (4) hysteretic coupling circuits $44_1$, $44_2$, $44_3$ and $44_4$ arranged in parallel with each other. The output, for example, the output on signal path $34_1$ is routed to the summing amplifier $40_1$ and also to the resistor $38_1$. The output of signal path 34 comprises the outputs of hysteretic coupling circuits $44_1$ and $44_2$, in a manner as previously discussed with reference to FIGS. 2 and 3, that are separately routed to the summing device $14_1$ and $40_1$ and feedback resistor $42_1$. The operation of the operational amplifiers $36_1$ and $36_2$, the summing amplifiers $40_1$ and $40_2$ (not shown) and the hysteretic coupling circuit $44_1$ perform in the same manner as previously described with reference to FIGS. 2 and 3.

It should now be appreciated that the practice of the present invention provides for a signal input network that not only develops binary signals, such as those described with reference to FIG. 5, but also, if desired, optical signals, such as that described with reference to FIG. 6, that are applied to the interconnecting network 74.

Figure 7:
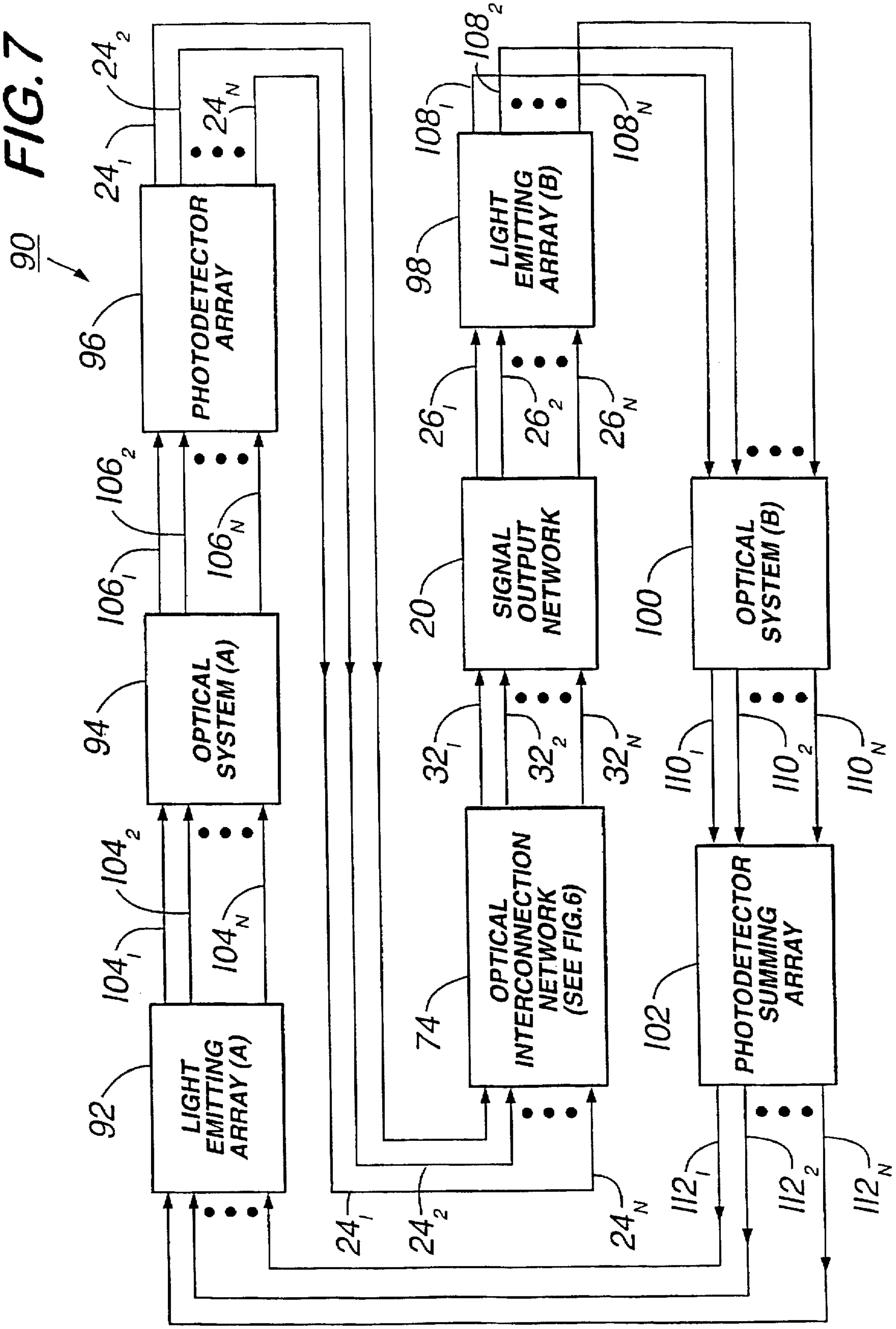
FIG. 7 illustrates a block diagram comprising the optical interconnecting network of FIG. 6 used for interconnecting different optical systems.

The optical interconnecting network 74 of FIG. 6 may also be used in a system 90 to provide interconnections between optical systems and such an optical electronic system 90 is illustrated in FIG. 7 and comprises elements given in Table 2.

TABLE 2

| REFERENCE NO. | ELEMENT |
|---|---|
| 20 | Signal Output Network |
| 74 | Optical Interconnecting Network |
| 92 | Light Emitting Array (A) |
| 94 | Optical System (A) |
| 96 | Photodetector Array |
| 98 | Light Emitting Array (B) |
| 100 | Optical System (B) |
| 102 | Photoconductor Summing Array |
| $104_1$, $104_2$, . . . $104_N$ | Optical Fibers |
| $106_1$, $106_2$, . . . $106_N$ | Optical Fibers |
| $24_1$, $24_2$, . . . $24_N$ | Optical Fibers |
| $108_1$, $108_2$, . . . $108_N$ | Optical Fibers |
| $110_1$, $110_2$, . . . $110_N$ | Optical Fibers |

The optical electronic system 90 utilizes optical fibers $104_1$, $106_1$ . . . $108_N$ as the means for transmitting optical signals and for interconnecting the various elements of the optical electronic system 90 as shown in FIG. 7. Similarly, the input signals to the optical interconnection network 74 are provided by optical fibers $24_1$, $24_2$, . . . $24_N$ in a manner similar to that described with reference to FIG. 6. The photoconductor summing array 102 is electrically coupled to the light emitter array (A) 92 by signal paths $112_1$ . . . $112_N$ that conduct electronic (non-light) signals.

In operation, and starting with the signals of interest applied to the optical system (A) 94, the light emitter array (A) 92 applies the signals of interest to the optical system (A) 94 via fiber optics $104_1$ . . . $104_N$ which, in turn, provides associated optical signals, via fiber optics $106_1$ . . . $106_N$, to the photodetector array 96 which, in turn, applies associated optical signals, via fiber optics $24_1$ . . . $24_N$, to the interconnecting network 74 which, in turn, applies electronic signals to the signal output network 20 so that the signal of interest applied optical system (A) 94 having the highest initial amplitude is given priority in its decoding by the optical interconnection network 74, in a manner as previously described with reference to FIG. 6.

The signal output network 20 delivers the output signals thereof on signal path $26_1$, $26_2$, . . . $26_N$ which are routed to the light emitting array 98 which, in turn, delivers representative optical signals to optical system (B) 100. The optical system (B) delivers its associated optical signals back to the light emitting array (A) 92 via the photoconductor summing array 102 and signal paths $112_1$, $112_2$, . . . $112_N$ arranged as shown in FIG. 7. The primary feature of the optical electronic arrangement 90 is provided by the optical interconnection network 74 that responds to the highest initial amplitude signal of the signals of interest, while rendering ineffective those signals of interest having a lesser amplitude even though they might occur simultaneously with the highest amplitude signal.

It should now be appreciated that the practice of the present invention provides for an optical interconnection network 74 that brings together two optical systems (A and B) and allows one optical system (B) to initially respond to the signal of interest of the other optical system having the highest initial optical amplitude.

It should now be appreciated that the practice of the present invention provides for an interconnection network comprising hysteretic coupling circuits $44_1$ . . . $44_N$ that may be adapted for many applications including optimum computation to determine scheduling operations that may find use in military, as well as commercial applications, including factory automation and security services. Further, the practice of the present invention is also applicable to computer architecture because of its rapid response to the switches (such as those comprising amplifiers $12_1$ . . . $12_N$ and summing devices $14_1$ . . . $14_N$) in a network needed to provide for inter-processing communications.

Obviously, numerous other modifications and variations of the present invention are possible in light of the foregoing teachings. It is, therefore, to be understood that within the scope of the appended claims the invention may be practiced otherwise and as specifically described.

What I claim is:

1. A network for interconnecting input and output signal networks, said interconnecting network receiving a plurality of signals of interest from said input network which sometimes occur simultaneously, said interconnecting network responding to the signal of interest having the highest initial voltage amplitude so as to provide priority decoding of said signals of interest, said interconnecting network comprising:

(a) at least first and second amplifiers with inputs and outputs with an input signal path connected to at least first and second signals of interest, said first and second amplifiers each providing a respective first and second amplifier output signal each of which is routed to said output network;

(b) a coupling network having a predetermined coupling factor that includes a predetermined time constant and which receives said first and second amplifier output signals, said coupling network having means for developing a signal proportional to the integral of a product of said received first and second output signals and providing first and second priority select output signals each of which is at least proportional to the product of said first and second amplifier output signals; and (c) at least first and second summing devices having inputs and outputs wherein respective feedback paths are provided between said first and second summing devices and said first and second amplifiers said input of said first summing device and said input of said second summing device respectively receiving said first priority select output signal and said second priority select output signal, said outputs of said at least first and second summing devices providing said feedback signal path and being respectively connected to said input signal paths of said at least first and second amplifiers.

2. The network according to claim 1, wherein said coupling network comprises a plurality of hysteretic coupling circuits of a number $N^2$, where N corresponds to the number of said amplifiers, each of said hysteretic coupling circuit receiving said amplifier output signals and developing a respective priority select output signal.

3. The network according to claim 2, wherein each of said hysteretic coupling circuits comprises:

(a) a first analog multiplier receiving each of said amplifier output signals and developing a first product signal of said received signals;

(b) an integrating circuit receiving said first product signal and having components selected to establish said predetermined time constant, said integrating circuit developing a delayed output signal representative of said first product signal and said predetermined time constant; and (c) a second analog multiplier receiving at least one of said amplifier output signals and said delay output signal, said second analog multiplier developing said respective priority select output signal which is representative of an integral function developed with respect to said predetermined time constant.

4. The network according to claim 3, wherein said hysteretic coupling circuit further comprises a resistive load connecting said respective priority select output signal to its respective summing device.

5. The network according to claim 3, wherein the integrating circuit comprises:

an operational amplifier coupled to receive said first product signal of said first analog multiplier;

diode means for interconnecting said operational amplifier of said integrating circuit to the first analog multiplier and for preventing negative integration during said development of the priority select output signals;

circuit weighting means interconnecting said operational amplifier between said first and said second analog multipliers, said circuit weighting means controlling the voltage gain of the hysteretic circuit; and a grounded leakage resistor coupled to the output of said first analog multiplier.

6. The network according to claim 1, wherein said input network comprises a first arrangement of weighting networks interconnected to each other and connected to receive said signals of interest and having predetermined parameters selected to provide a first predetermined pattern of said signals of interest that is applied to said at least first and second amplifiers.

7. The network according to claim 1, wherein said output network comprises a second arrangement of weighting networks interconnected to each other and connected to receive said output signals of said at least first and said amplifiers and having predetermined parameters selected to provide a predetermined pattern of output signals of said output network.

8. The network according to claim 1, wherein said input network comprises a plurality of binary digit registers having respective outputs that are connected to digital-to-analog converter means operatively connected to the inputs of said at least first and second amplifiers.

9. The network according to claim 1, wherein said input network has an output stage comprising photovoltaic devices.

10. The network according to claim 1, wherein said coupling network has an output stage comprising light emitting devices.

* * * * *